(12) United States Patent
Shen

(10) Patent No.: US 7,683,350 B2
(45) Date of Patent: Mar. 23, 2010

(54) ION IMPLANTATION METHOD

(75) Inventor: Cheng-Hui Shen, Hukou Township, Hsinchu County (TW)

(73) Assignee: Advanced Ion Beam Technology, Inc., Hsinchu (TW)

( * ) Notice: Subject to any disclaimer, the term of this patent is extended or adjusted under 35 U.S.C. 154(b) by 116 days.

(21) Appl. No.: 12/126,335

(22) Filed: May 23, 2008

(65) Prior Publication Data

US 2009/0230329 A1 Sep. 17, 2009

(30) Foreign Application Priority Data

Mar. 14, 2008  (TW) .............................. 97109176 A

(51) Int. Cl.
*H01J 37/317* (2006.01)
*H01J 37/08* (2006.01)
*H01L 21/265* (2006.01)
*G21K 5/00* (2006.01)

(52) U.S. Cl. ............................. 250/492.21; 250/492.22; 250/492.2; 250/396 R

(58) Field of Classification Search ............ 250/492.21, 250/492.22, 492.2, 396 R
See application file for complete search history.

(56) References Cited

U.S. PATENT DOCUMENTS

2005/0181584 A1 * 8/2005 Foad et al. .................. 438/514
2006/0289800 A1 * 12/2006 Murrell et al. ......... 250/492.21
2009/0090876 A1 * 4/2009 Shen et al. ............. 250/492.21

* cited by examiner

*Primary Examiner*—Nikita Wells
(74) *Attorney, Agent, or Firm*—Muncy, Geissler, Olds & Lowe, PLLC

(57) ABSTRACT

An ion implantation method is provided. The method, before ion implanting, is to rotate the substrate by an angle and shift the scan path of the ion beam with an interlace pitch in the direction perpendicular to the scan direction and on the plane of the substrate. Therefore a plurality of interlaced and not overlapped ion implantation scan lines are formed on the surface of the substrate, so the method can enhance the uniformity of the dose of the ion implantation in the substrate.

11 Claims, 6 Drawing Sheets

ION IMPLANTATION METHOD

BACKGROUND OF THE INVENTION

1. Field of Invention

This invention relates to an ion implantation method and, in particular, the method can improve the uniformity of ion implantation.

2. Background of the Related Art

The different stages of an implantation method according to the prior art are shown in FIG. 1a~FIG. 1d. An ion beam scans a substrate S along a scan path to implant ions onto the substrate surface and forms a plurality of parallel ion implantation scan lines on the surface of the substrate S, that is called an ion implantation scan pass.

As shown in FIG. 1a for explaining the execution of one ion implantation scan pass, the ion beam implants ions on the substrate S along a first direction, the direction parallel to that of a first scan path 21, to form an ion implantation scan line. And then the ion beam shifts with a scan pitch T in a second direction perpendicular to the first direction. Continuously, the ion beam implants ions onto the substrate S along the reverse direction of the first direction to form another ion implantation scan line. The procedure is repeated to form a plurality of ion implantation scan lines on the substrate till the scan area covers the whole substrate S. In FIG. 1a, the plurality of ion implantation scan lines is marked 1 and the arrow mark 100 represents the orientation of the substrate S.

Next, the substrate is rotated by 90 degree on the plan of the substrate S, and the ion beam is shifted with an interlace pitch T/2 (half scan pitch) along the second direction. And then the procedure of the ion implantation scan pass is repeated to form a plurality of ion implantation scan lines 2, which is perpendicular to the direction of the plurality of ion implantation scan lines 1, and the dotted lines represent the second scan path 22 as shown in FIG. 1b.

The step shown in FIG. 1b is then further repeated two times, so as to complete the third time and the forth time of the ion implantation scan pass to form another plurality of ion implantation scan lines 1 and 2, as shown in FIG. 1c and FIG. 1d, respectively. Rotate the substrate S by 180 degree (i.e. continuous two rotations of 90 degree). The ion implantation scan lines formed by the first time of the ion implantation scan pass overlaps the ion implantation scan lines formed by the third time, and the ion implantation scan lines formed by the second time overlaps the ion implantation scan lines formed by the forth time. Therefore the third time and the forth time of the ion implantation scan pass are still marked 21 and 22, and the plurality of ion implantation scan lines formed are also still marked 1 and 2.

The dose of the ion implantation on the surface of the substrate S is illustrated in FIG. 2, where $D(x)$ represents the distribution variation function of the dose. The larger value of $D(x)$ is, and the worse the uniformity is. On contrary, the smaller value of $D(x)$ is, the better the uniformity is.

For one ion implantation scan line, the farther the ion beam is away from the center of the ion implantation scan line, the smaller the dose of the ion implantation is. The first time of the ion implantation scan pass overlapping the third time of the ion implantation scan pass and the second time of the ion implantation scan pass overlapping the forth time of the ion implantation scan pass renders a larger value of the distribution variation function $D(x)$, resulting in a poor uniformity.

SUMMARY OF THE INVENTION

It is an object of this invention to provide an ion implantation method, which can improve the uniformity of the dose of the ion implantation. The method shifts the ion beam with an interlace pitch in the direction perpendicular to the scan direction, and the interlace pitch makes that ion implantation scan lines formed on substrate at 0 orientation degree do not overlap ion implantation scan lines formed on substrate at 180 orientation degree, and the uniformity is thus improved.

DETAILED DESCRIPTION OF THE INVENTION

For understanding this invention better, a quad ion implantation method according to an embodiment of this invention is illustrated and shown in FIG. 3a-FIG. 3d.

Figure 1A:
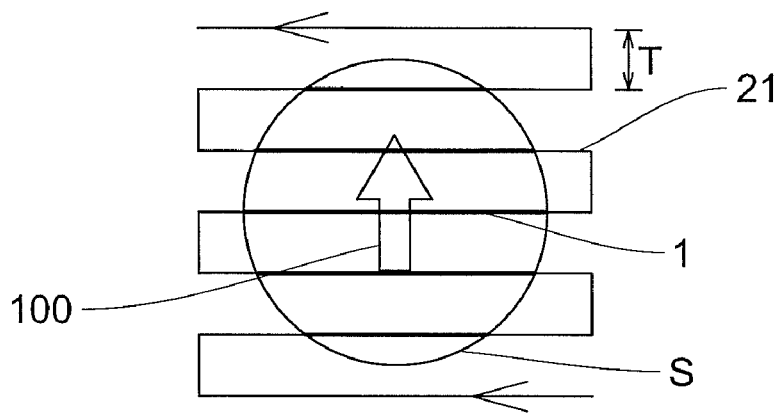
FIG. 1a~FIG. 1d show the different stages of an ion implantation method according to a prior art.
Figure 1B:
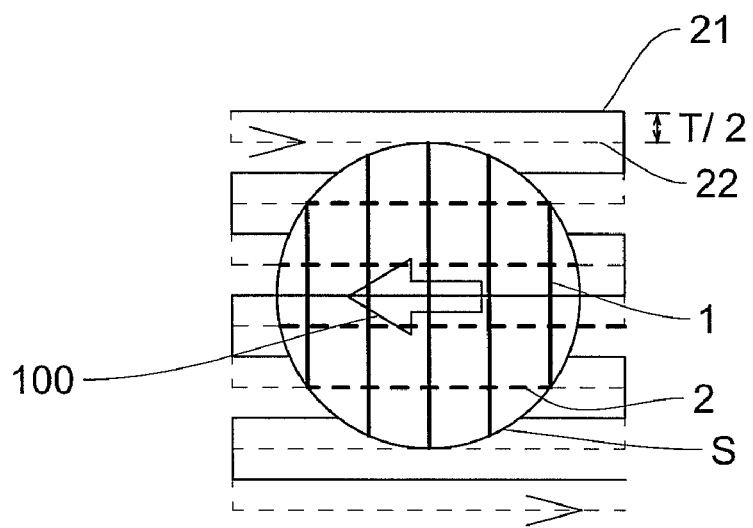
Figure 1C:
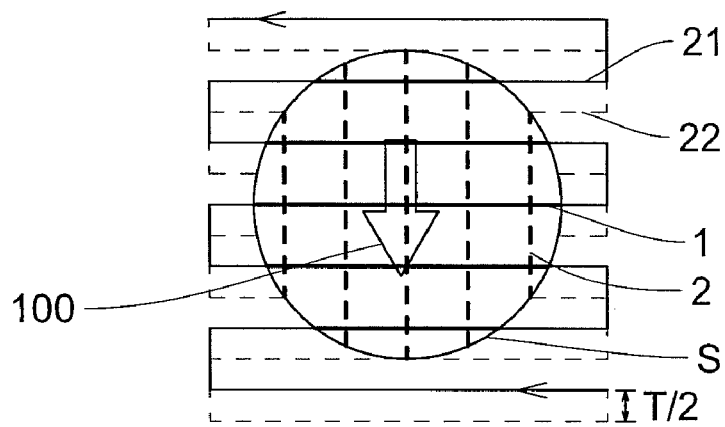
Figure 1D:
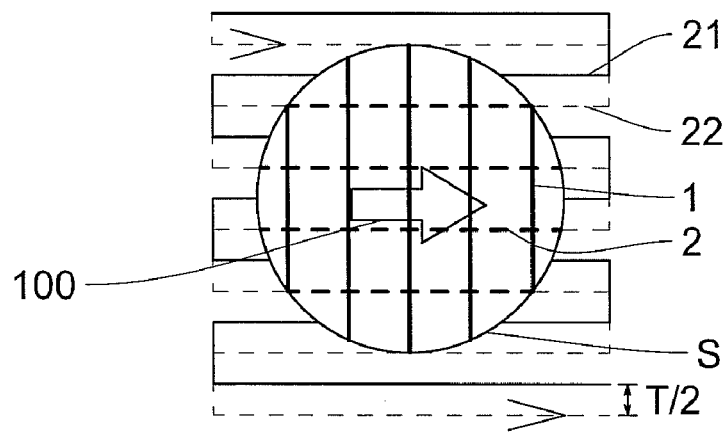
Figure 2:
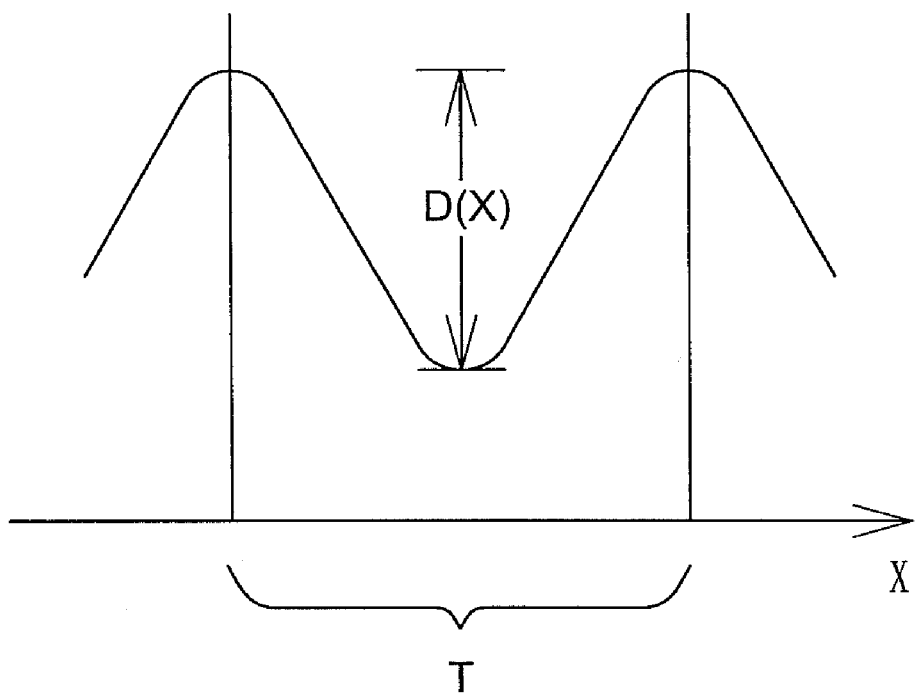
FIG. 2 shows the uniformity of the dose of the ion implantation according to the prior art.
Figure 3A:
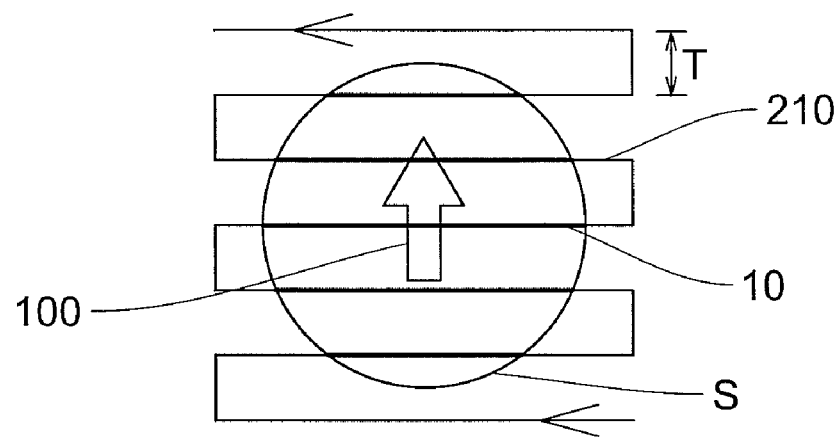
FIG. 3a~FIG. 3d show the stages of an ion implantation method according to an embodiment of this invention.

As shown in FIG. 3a, ion beam finishes an ion implantation scan pass along a ion scan path 210, and ions are implanted onto the surface of a substrate S to form a plurality of ion implantation scan lines 10, where the arrow mark 100 represents the orientation of the substrate S.

The ion implantation scan pass is illustrated as follows. First, the ion beam scans the substrate S along a first direction of a scan path 210 to implant the ions onto the surface of the substrate S to form an ion implantation scan line. And then the ion beam shifts with a scan pitch T along a second direction, which is perpendicular to the first direction and parallel to the plan of the substrate S. Continuously, the ion beam implants the ions onto the substrate S along the reverse direction of the first direction to form another ion implantation scan line. The procedure is repeated to form another plurality of parallel ion implantation scan lines and so on till the scan area contains the whole substrate S.

Figure 3B:
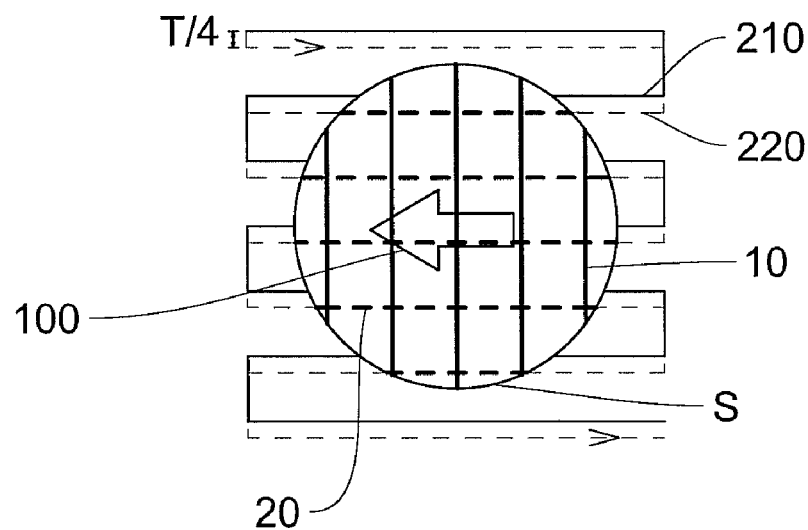

Next, the substrate S is rotated by 90 degree, and then a second time of the ion implantation scan pass follows along the scan path 220, as shown FIG. 3b. Before proceeding the second time of the ion implantation scan pass, the ion beam is shifted with an interlace pitch T/4 (quarter of the scan pitch T) so as to form another plurality of ion implantation scan lines 20 after the second time of the ion implantation scan pass. The plurality of ion implantation scan lines 20 is perpendicular to the plurality of ion implantation scan lines 10.

Figure 3C:
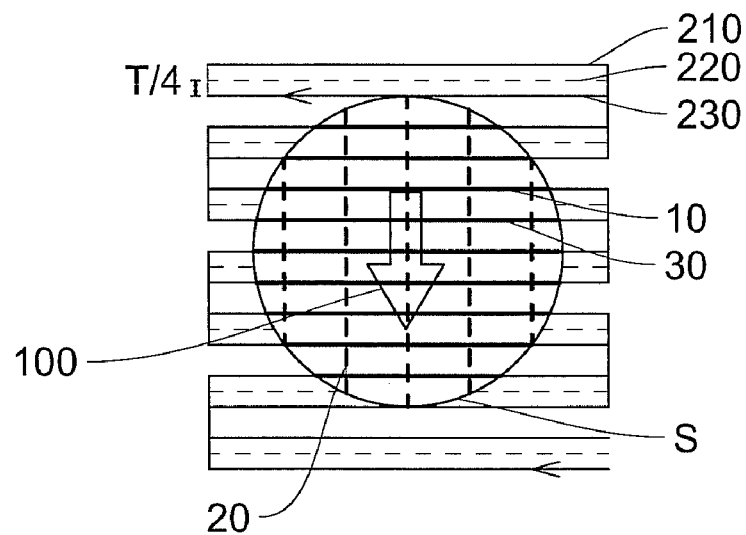

Continuously, the substrate is rotated by 90 degree again, and then ion beam is shifted with an interlace pitch T/4, and a third time of the ion implantation scan pass follows along the scan path 230 as shown in FIG. 3c. The plurality of ion implantation scan lines 30 are formed and parallel to the plurality of ion implantation scan lines 10.

Figure 3D:
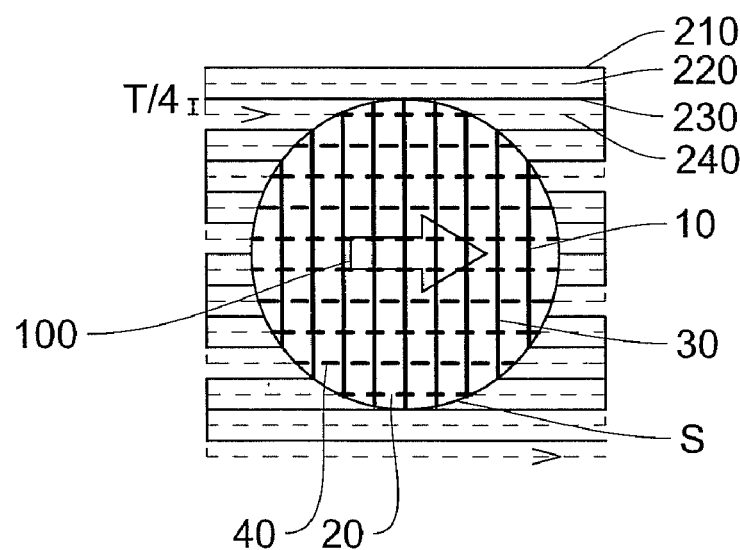

The similar procedure is preceded again. Rotate the substrate S by 90 degree, and shift the ion beam with the interlace pitch T/4, and a forth time of ion implantation scan pass follows along the scan path 240 as shown in FIG. 3d. A plurality of ion implantation scan lines 40 are formed and parallel to the plurality of ion implantation scan lines 20.

The plurality of ion implantation scan lines 10 shown in FIG. 3a and the plurality of ion implantation scan lines 30 shown in FIG. 3c are parallel to each other but interlaced by an interlace space T/2. In the same reason, it can be understood that the plurality of ion implantation scan lines 20 shown in FIG. 3b and the plurality of ion implantation scan lines 40 shown in FIG. 3d are parallel to each other but interlaced by an interlace space T/2 also.

It is noted that the motion of shifting the ion beam during an ion implantation scan pass is achieved by the movement of either the ion beam or the substrate S itself.

Figure 4:
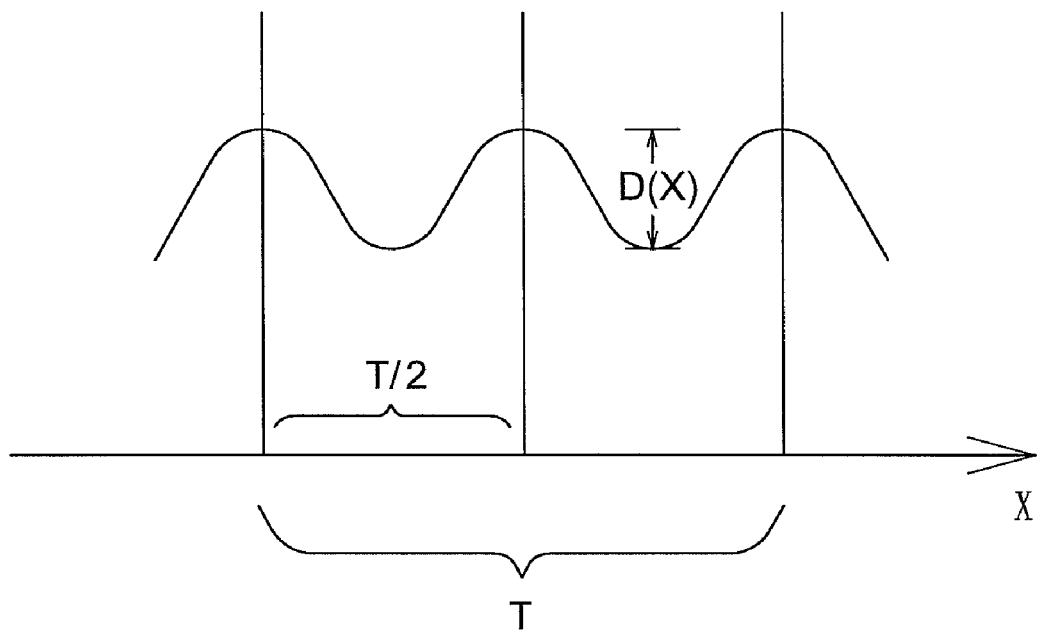
FIG. 4 shows the uniformity of an ion dose according to an embodiment of this invention.

The uniformity of the dose is shown in FIG. 4 and illustrated as follows. The parallel pluralities of ion implantation scan lines are interlaced by an interlace T/2, so the value of distribution variation function $D(x)$ is reduced, and therefore the uniformity is enhanced.

The quad ion implantation method can be extended to any orientation of the substrate S. The point is that, after rotating the substrate S by 180 degree, the formed ion implantation scan line must lie between two ion implantation scan lines formed before substrate S was rotated i.e. when the orientation of S is 0 degree. The general method is explained as follows.

At the 0 degree orientation of the substrate S, an ion implantation scan pass is proceeded.

Continuously, the substrate S is rotated by 180/n degree and the ion beam is shifted with an interlace pitch T/2 n, where n is a positive integer equal to or larger than 2 and T is the ion scan pitch.

One ion implantation scan pass is proceeded for each rotation of the substrate S, and that is repeated for 2 n−1 times till covering the whole substrate S. The method is called 2 n ion implantation method, for example, the method is called quad ion implantation method as n=2.

Although this invention has been explained in relation to its preferred embodiment, it is to be understood that modifications and variation can be made without departing the spirit and scope of the invention as claimed.

What is claimed is:

1. An ion implantation method comprising:
   proceeding an ion implantation scan pass to form a plurality of parallel ion implantation scan lines on a substrate, wherein said ion implantation scan pass is to form an ion implantation scan line parallel to a first direction via an ion beam, and then to shift said ion beam with a scan pitch along a second direction, which is on the plane of said substrate and is perpendicular to said first direction, and then to form another ion implantation scan line via said ion beam along the reverse direction of said first direction, and then to repeat the procedure to form said plurality of parallel ion implantation scan lines on said substrate;
   rotating said substrate by 180/n degree, shifting said ion beam with an interlace pitch T/2 n along said second direction and repeating one time of said ion implantation scan pass, wherein n is a positive integer equal to or larger than 2 and T is said scan pitch; and
   repeating the step of rotating said substrate, the step of shifting said ion beam and the step of proceeding said ion implantation scan pass for 2 n−1 times to form interlaced and non-overlapped ion implantation scan lines on said substrate.

2. An ion implantation method according to claim 1, wherein the step of shifting said ion beam with said scan pitch is to move said substrate.

3. An ion implantation method according to claim 1, wherein the step of shifting said ion beam with said scan pitch is to move said ion beam.

4. An ion implantation method according to claim 1, wherein the step of shifting said ion beam with said interlace pitch is to move said substrate.

5. An ion implantation method according to claim 1, wherein the step of shifting said ion beam with said interlace pitch is to move said ion beam.

6. An ion implantation method according to claim 1, wherein said integer n is equal to 2.

7. A ion implantation method comprising:
   proceeding first time of an ion implantation scan pass to form a plurality of parallel ion implantation scan lines on a substrate, wherein said ion implantation scan pass is to form an ion implantation scan line parallel to a first direction via an ion beam, and then to shift said ion beam with a scan pitch along a second direction, which is on the plane of said substrate and is perpendicular to said first direction, and then to form another ion implantation scan line via said ion beam along the reverse direction of said first direction, and then to repeat the procedure to form said plurality of parallel ion implantation scan lines on said substrate;
   rotating said substrate by 90 degree and shifting said ion beam with an interlace pitch T/4 along said second direction, wherein T is said scan pitch;
   proceeding second time of said ion implantation scan pass;
   rotating said substrate by 90 degree and shifting said ion beam with said interlace pitch along said second direction;
   proceeding third time of said ion implantation scan pass;
   rotating said substrate by 90 degree and shifting said ion beam with said interlace pitch along said second direction; and
   proceeding forth time of said ion implantation scan pass to form perpendicularly interlaced and non-overlapped ion implantation scan lines on said substrate.

8. An ion implantation method according to claim 7, wherein the step of shifting said ion beam with said scan pitch is to move said substrate.

9. An ion implantation method according to claim 7, wherein the step of shifting said ion beam with said scan pitch is to move said ion beam.

10. An ion implantation method according to claim 7, wherein the step of shifting said ion beam with said interlace pitch is to move said substrate.

11. An ion implantation method according to claim 7, wherein the step of shifting said ion beam with said interlace pitch is to move said ion beam.

* * * * *